US012505788B2

(12) United States Patent
Lee et al.

(10) Patent No.: US 12,505,788 B2
(45) Date of Patent: Dec. 23, 2025

(54) OPTOELECTRONIC DEVICE

(71) Applicant: Aledia, Echirolles (FR)

(72) Inventors: Jaehoon Lee, Grenoble (FR); Frédéric Mercier, Coublevie (FR); Ivan Petkov, Saint Martin d'Heres (FR)

(73) Assignee: Aledia, Champagnier (FR)

( * ) Notice: Subject to any disclaimer, the term of this patent is extended or adjusted under 35 U.S.C. 154(b) by 0 days.

(21) Appl. No.: 18/879,733

(22) PCT Filed: Jun. 27, 2023

(86) PCT No.: PCT/EP2023/067508
§ 371 (c)(1),
(2) Date: Dec. 27, 2024

(87) PCT Pub. No.: WO2024/003071
PCT Pub. Date: Jan. 4, 2024

(65) Prior Publication Data

US 2025/0316210 A1 Oct. 9, 2025

(30) Foreign Application Priority Data

Jun. 29, 2022 (FR) ...................................... 2206564

(51) Int. Cl.
*G09G 3/32* (2016.01)
*H10H 29/01* (2025.01)
*H10H 29/49* (2025.01)

(52) U.S. Cl.
CPC ............. *G09G 3/32* (2013.01); *H10H 29/012* (2025.01); *H10H 29/0364* (2025.01); (Continued)

(58) Field of Classification Search
CPC ............. G09G 3/32; G09G 2300/0408; G09G 2320/064; H10H 29/012; H10H 29/0364; H10H 29/49
See application file for complete search history.

(56) References Cited

U.S. PATENT DOCUMENTS 7,259,740 B2 * 8/2007 Haga .................... G09G 3/3688 345/98
8,035,132 B2 * 10/2011 Haga .................... G09G 3/3688 257/204

(Continued)

FOREIGN PATENT DOCUMENTS

CN 111108543 A 5/2020
CN 111108599 A 5/2020

(Continued)

OTHER PUBLICATIONS

Preliminary Search Report for French Application No. 2206564, dated Feb. 15, 2023.

(Continued)

*Primary Examiner* — Vinh T Lam
(74) *Attorney, Agent, or Firm* — Wolf, Greenfield & Sacks, P.C.

(57) ABSTRACT

A chip including: four connection pads receiving respectively a supply voltage, a reference voltage, a first data signal, and a second data signal; at least two pixels; at least two drivers, each driver being configured to control one of the pixels, the drivers being coupled in a sequence; each driver including a first input and a first output, the first output of each driver being coupled to the first input of the following driver in the sequence, each driver being configured, in a programing step, to be programmed by storing digital data from the second data signal, and, in a display step, to drive one of the pixels from the stored digital data and from the first data signal.

15 Claims, 8 Drawing Sheets

(52) U.S. Cl.
CPC ..... *H10H 29/49* (2025.01); *G09G 2300/0408* (2013.01); *G09G 2320/064* (2013.01)

(56) References Cited

U.S. PATENT DOCUMENTS

| | | | | |
|---|---|---|---|---|
| 9,218,765 | B2 * | 12/2015 | Kim | G09G 3/3233 |
| 9,223,161 | B2 * | 12/2015 | Ogasawara | G09G 3/3677 |
| 9,595,222 | B2 * | 3/2017 | Takahara | G09G 3/3233 |
| 10,410,594 | B2 * | 9/2019 | Yonebayashi | G09G 3/20 |
| 10,997,899 | B1 * | 5/2021 | Bae | G09G 3/2092 |
| 11,024,258 | B2 * | 6/2021 | Jeong | G09G 3/3266 |
| 11,385,473 | B2 * | 7/2022 | Balogh | G02B 30/27 |
| 11,670,226 | B1 * | 6/2023 | Wu | G09G 3/32 345/55 |
| 11,922,873 | B2 * | 3/2024 | Van Eessen | G09G 3/32 |
| 2002/0142504 | A1 | 10/2002 | Feldman et al. | |
| 2010/0149139 | A1 * | 6/2010 | Kroll | G02B 26/0875 345/204 |
| 2012/0062545 | A1 * | 3/2012 | Kim | G09G 3/3233 345/212 |
| 2017/0061867 | A1 | 3/2017 | Cok et al. | |
| 2017/0188427 | A1 | 6/2017 | Cok et al. | |
| 2017/0206820 | A1 | 7/2017 | Cok et al. | |
| 2018/0211582 | A1 * | 7/2018 | Sakariya | G09G 3/32 |
| 2018/0342191 | A1 | 11/2018 | Cok et al. | |
| 2020/0152113 | A1 | 5/2020 | Hugon et al. | |
| 2020/0161520 | A1 | 5/2020 | Hugon et al. | |
| 2023/0162677 | A1 * | 5/2023 | Huitema | G09G 3/32 345/55 |

FOREIGN PATENT DOCUMENTS

| | | | |
|---|---|---|---|
| EP | 1227468 | A2 | 7/2002 |
| EP | 3655944 | A1 | 5/2020 |
| EP | 3655990 | A1 | 5/2020 |
| FR | 3069378 | A1 | 1/2019 |
| FR | 3069379 | A1 | 1/2019 |
| JP | 2002-268587 | A | 9/2002 |
| JP | 2020-527756 | A | 9/2020 |
| JP | 2020-527757 | A | 9/2020 |
| JP | 7146893 | B2 | 10/2022 |
| JP | 7153711 | B2 | 10/2022 |
| KR | 20200028012 | A | 3/2020 |
| KR | 20200033882 | A | 3/2020 |
| TW | 201909156 | A | 3/2019 |
| TW | 201919201 | A | 5/2019 |
| WO | WO 2019/016481 | A1 | 1/2019 |
| WO | WO 2019/016482 | A1 | 1/2019 |

OTHER PUBLICATIONS

International Search Report and Written Opinion for International Application No. PCT/EP2023/067508, mailed Sep. 7, 2023.

* cited by examiner

OPTOELECTRONIC DEVICE

This Application is a national stage filing under 35 U.S.C. 371 of International Patent Application Serial No. PCT/EP2023/067508, filed Jun. 27, 2023, which claims priority to French patent application FR2206564, filed Jun. 29, 2022. The contents of these applications are incorporated herein by reference in their entirety.

TECHNICAL FIELD

The present disclosure relates generally to optoelectronic devices, and in particular optoelectronic devices comprising several pixels

BACKGROUND ART

In order to obtain a high density of pixels in an optoelectronic device, for example a screen, the size of the manufactured pixels diminishes constantly.

However, pixels are often manufactured as independent elements to be placed and connected together on a support. In this case, the size of each pixel, which allows the wanted high density, causes difficulties in the placement of the pixels, in particular when using methods, such as the pick and place method.

SUMMARY OF INVENTION

One embodiment addresses all or some of the drawbacks of known optoelectronic devices.

An object of an embodiment is to provide a chip comprising several pixels and their drivers, controlled by the same signals provided to the chip.

An object of an embodiment is to permit the formation of screen with a high density of pixels.

An object of an embodiment is to provides chips more easily move by a process of the pick and place type, without diminishing the density of pixels.

One embodiment provides a method of controlling a chip, the chip comprising:

- four connection pads, the pads receiving respectively a supply voltage, a reference voltage, a first data signal, and a second data signal;
- at least two pixels;
- at least two drivers, each driver being configured to control one of the pixels, the drivers being coupled in a sequence;
- each driver comprising a first input and a first output, the first output of each driver being coupled to the first input of the following driver in the sequence, each driver being configured, in a programing step, to be programmed by storing digital data from the second data signal, and, in a display step, to drive one of the pixels from the stored digital data and from the first data signal, the method comprising:
- providing all drivers of the sequence with a first control signal among the first data signal, the second data signal, and a third data signal, and providing all drivers of the sequence with a second control signal among the first data signal, the second data signal, and the third data signal or having all the drivers generate the second control signal;
- providing a third control signal among the first data signal, the second data signal and the third data signal to the first input of the first driver of the sequence to initiate the programming step;

- transmitting, for each driver of the sequence, after the programming of one of drivers of the sequence, the third control signal to the next driver of the sequence by their respective first output and first input, the programmed driver being configured to ignore the first or third control signal until the end of the programming of all the drivers of the sequence; and
- when all the drivers are programmed, having all the drivers monitoring the first and third control signals for starting the display step.

According to an embodiment, the drivers belong to a monolithic driver circuit.

According to an embodiment, each driver comprises at least a second, a third and a fourth input, the second inputs being coupled, by conductive tracks of the monolithic driver circuit, to each other and to the pad being provided with the supply voltage, the third inputs being coupled, by conductive tracks of the monolithic driver circuit, to each other and to the pad being provided with the reference voltage, the fourth inputs being coupled, by conductive tracks of the monolithic driver circuit, to each other and to the pad being provided with the second data signal.

According to an embodiment, the second control signal is provided to all the drivers.

According to an embodiment, the first control signal is the second data signal, the second control signal is the third data signal, and the third control signal is the first data signal.

According to an embodiment, each driver comprises a fifth input coupled to the first output of the last driver of the sequence.

According to an embodiment, the first control signal is the second data signal, the second control signal is the first data signal, and the third control signal is the third data signal being a binary signal having a first value when programming possible, and a second value when not programming.

According to an embodiment, the first control signal is the second data signal, the second control signal is the third data signal, and the third control signal is the first data signal, and wherein each driver is configured to store the third data signal as a binary signal given a first value before the programming of the driver, and given a second value upon programming of the driver.

According to an embodiment, the beginning and/or the end of the programming of each driver are respectively indicated to the driver being programmed by a first and second combination of pattern of the first and second data signals.

According to an embodiment, the method comprises an alternance of programming steps and display steps during which the pixels are illuminated according to the programing of the drivers.

According to an embodiment, the beginning and the end of the display step are respectively indicated to the drivers by a third and fourth combination of pattern of the first and second data signals.

Another embodiment provides a method of controlling a device comprising a plurality of chips controlled by a method described before, the chips forming an array, the first data signal being provided to all the chips of the row of the chip to be programmed, the second data signal being provided to all the chips of the column of the chip to be programmed.

Another embodiment provides a chip, the chip comprising:

- four connection pads, the pads receiving respectively a supply voltage, a reference voltage, a first data signal, and a second data signal;

at least two pixels;

at least two drivers, each driver being configured to control one of the pixels, the drivers being coupled in a sequence;

each driver comprising a first input and a first output, the first output of each driver being coupled to the first input of the following driver in the sequence, each driver being configured, in a programing step, to be programmed by storing digital data from the second data signal, and, in a display step, to drive one of the pixels from the stored digital data and from the first data signal, the chip being configured to:

provide all drivers of the sequence with a first control signal among the first data signal, the second data signal, and a third data signal and providing all drivers of the sequence with a second control signal among the first data signal, the second data signal, and the third data signal or having all the drivers generate the second control signal;

provide a third control signal among the first data signal, the second data signal, and the third data signal to the first input of the first driver of the sequence to initiate the programming step;

transmit, for each driver of the sequence, after the programming of one of the drivers of the sequence, the third control signal to the next driver of the sequence by their respective first output and first input, the programmed driver being configured to ignore the first or third control signal until the end of the programming of all the drivers of the sequence; and when all the drivers are programmed, have all the drivers monitoring the first and third control signals for starting the display step.

Another embodiment provides a manufacturing method of a device as described before, comprising:

the formation of identical drivers on a wafer;

the formation of first conductive tracks in the wafer, the first conductive tracks being identical in every driver;

the cutting of the array of drivers corresponding to the chip;

the formation of second conductive tracks on the wafer, one of the second conductive tracks connecting the first output of the last driver of each row to the first input of the first driver of the next row; and the fixation of the array of drivers on a support comprising the pixels.

According to an embodiment, a first conductive track connects each first output of the drivers to the first input of the next driver in the same row.

BRIEF DESCRIPTION OF DRAWINGS

The foregoing features and advantages, as well as others, will be described in detail in the following description of specific embodiments given by way of illustration and not limitation with reference to the accompanying drawings, in which.

DESCRIPTION OF EMBODIMENTS

Like features have been designated by like references in the various figures. In particular, the structural and/or functional features that are common among the various embodiments may have the same references and may dispose identical structural, dimensional and material properties.

For the sake of clarity, only the operations and elements that are useful for an understanding of the embodiments described herein have been illustrated and described in detail.

Unless indicated otherwise, when reference is made to two elements connected together, this signifies a direct connection without any intermediate elements other than conductors, and when reference is made to two elements coupled together, this signifies that these two elements can be connected or they can be coupled via one or more other elements.

In the following disclosure, unless indicated otherwise, when reference is made to absolute positional qualifiers, such as the terms “front”, “back”, “top”, “bottom”, “left”, “right”, etc., or to relative positional qualifiers, such as the terms “above”, “below”, “higher”, “lower”, etc., or to qualifiers of orientation, such as “horizontal”, “vertical”, etc., reference is made to the orientation shown in the figures.

Unless specified otherwise, the expressions “around”, “approximately”, “substantially” and “in the order of” signify within 10%, and preferably within 5%.

Figure 1:
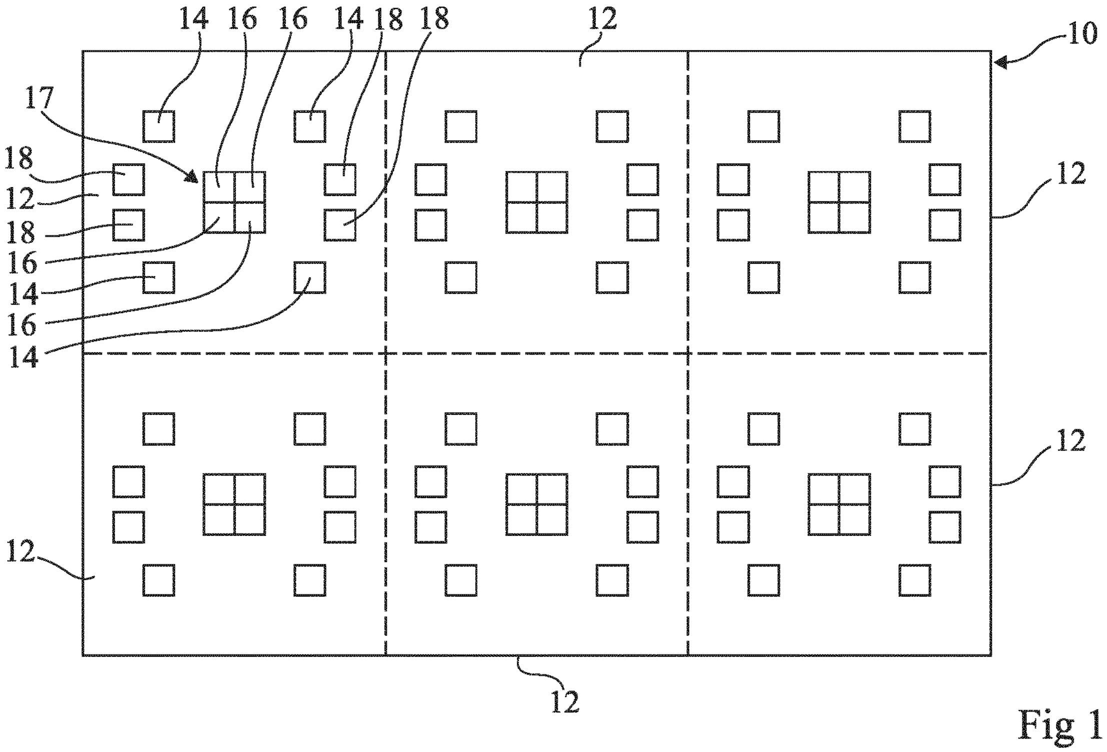
FIG. 1 illustrates an example of a screen comprising pixels according to an embodiment.

FIG. 1 illustrates an example of a screen 10 comprising chips 12 according to an embodiment.

The screen 10 comprises, in FIG. 1, only six chips. The screen 10 can comprise any number of chips 12, for example several millions of chips. The chips are placed next to each other, for example by a pick and place method. The chips 12 are for example fixed on a support, not represented.

The chips 12 form preferably an array. Each chip 12 is therefore located at the crossing of a row of chips of the array and a column of chips of the array. Each chip has for example a rectangular form, for example a square form. Preferably, the chips are connected to each other.

Each chip 12 comprises several pixels 14. More precisely, each chip comprises at least two pixels. For example, in FIG. 1, each chip 12 comprises four pixels 14. Each pixel 14 comprises for example at least one light emitting element, for example a light-emitting diode (LED). For example, each pixel 14 comprises three LEDs, a LED configured to emit red light, a LED configured to emit blue light and a LED configured to emit green light. The pixels are for example disposed in an array.

Each chip 12 further comprises a pixel driver 16 for each pixel 14, also called driver 16 thereafter. Therefore, each chip 12 comprises as many drivers 16 as pixels 14, each driver 16 being associated with a pixel 14, preferably a single pixel 14. In FIG. 1, each chip 12 comprises four drivers 16. The pixels drivers 16 are formed in and on a same semiconductor substrate and form a monolithic driver circuit 17. The drivers 16 are for example disposed in an array. For example, the array of drivers 16 has the same number of lines and of columns as the array of LEDs on the chip. The number of pixels on a single chip is for example limited by the number of drivers 16 that can be fitted on a same driver circuit 17 between the LEDs.

Each chip 12 comprises four, preferably only four, pads 18. Each of the pads 18 is configured to receive an external voltage, in other words, a voltage provided by a source outside the chip. Each chip 12 can only receive four voltages provided by a source outside the chip. A first pad 18 of each chip 12 is configured to receive a reference voltage GND, corresponding to the ground. A second pad 18 is configured to receive a supply voltage VCC. The supply voltage VCC is for example substantially constant while the screen 10 is functioning. The supply voltage VCC is for example higher than 1 V, for example comprised between 3 V and 6 V. A third pad 18 is configured to receive a signal ROW corresponding to the data associated with the rows of the array of chips, in other words a voltage received by all the chips of the same row. A fourth pad 18 is configured to receive a signal COL corresponding to the data associated with the columns of the array of chips, in other words a voltage signal received by all the chips of the same column. The signals ROW and COL are for example binary signals. In other words, the signals ROW and COL oscillate between a low value and a high value. For example, the signal COL comprises the data to be programmed, and the signal ROW constitutes a clock voltage. In other words, the data of the signal COL is read on every given edge, for example every rising edge, of signal ROW.

Preferably, the chips 12 and the LEDs of the pixels 14 are placed so that the LEDs of all the chips 12 form an array comprising rows and columns of LEDs. Preferably, all LEDs are at the same distance from the closest LEDs of the same rows and all LEDs are at the same distance from the closest LEDs of the same columns, regardless of if the closest LEDs are on the same chip or on another chip.

Figure 2:
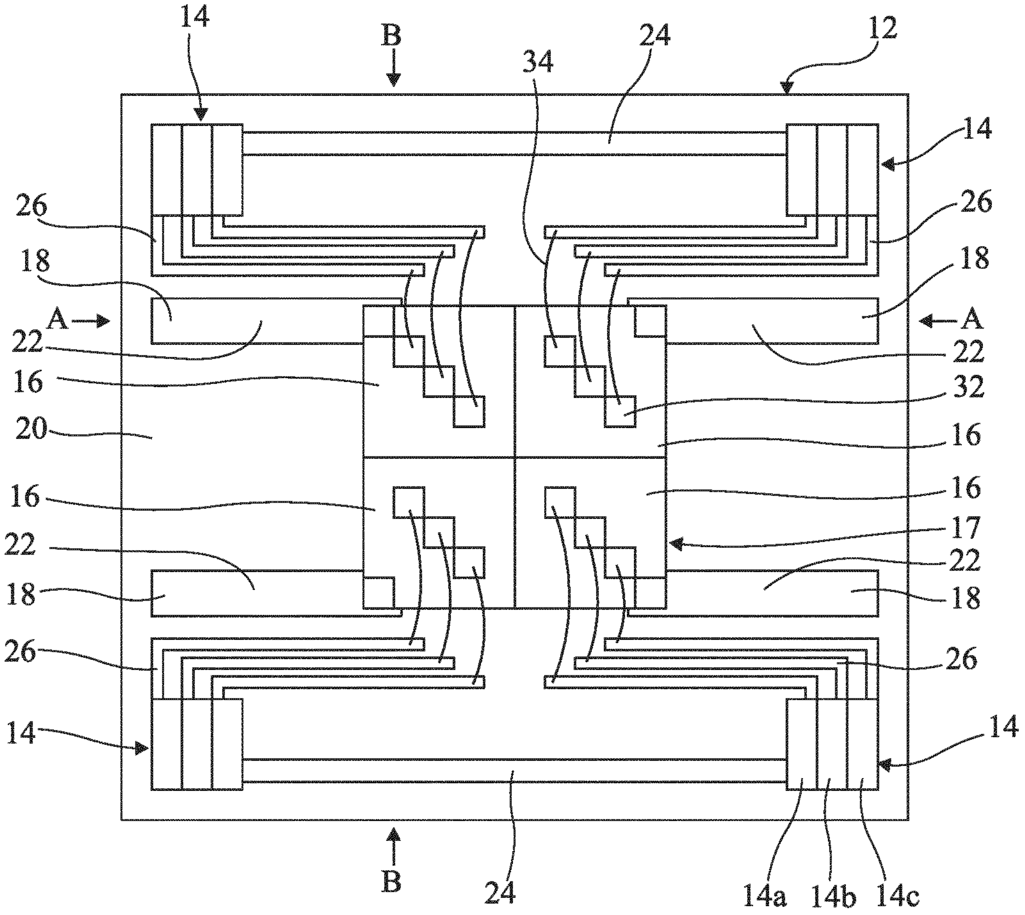
FIG. 2 illustrates, schematically, an embodiment of a chip comprising several pixels.
Figure 3A:
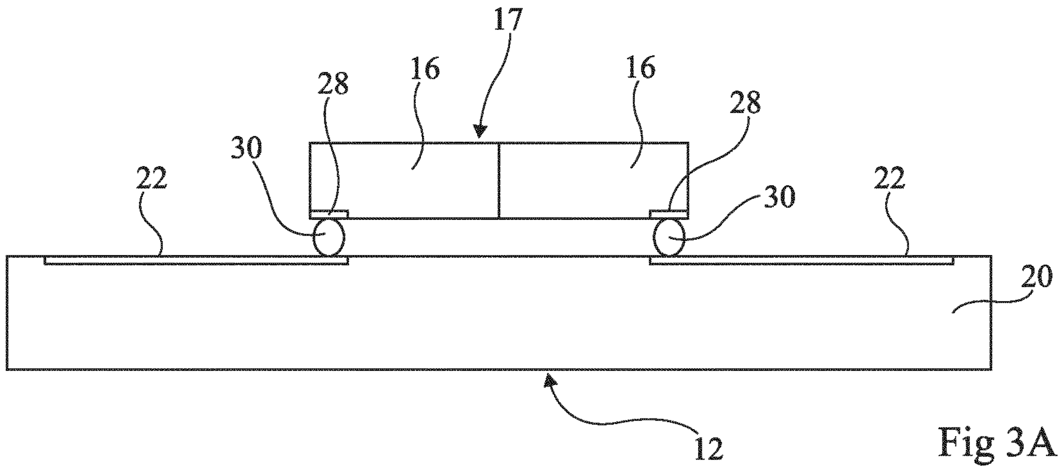
FIG. 3A illustrates, schematically, a side view of the embodiment of FIG. 2.
Figure 3B:
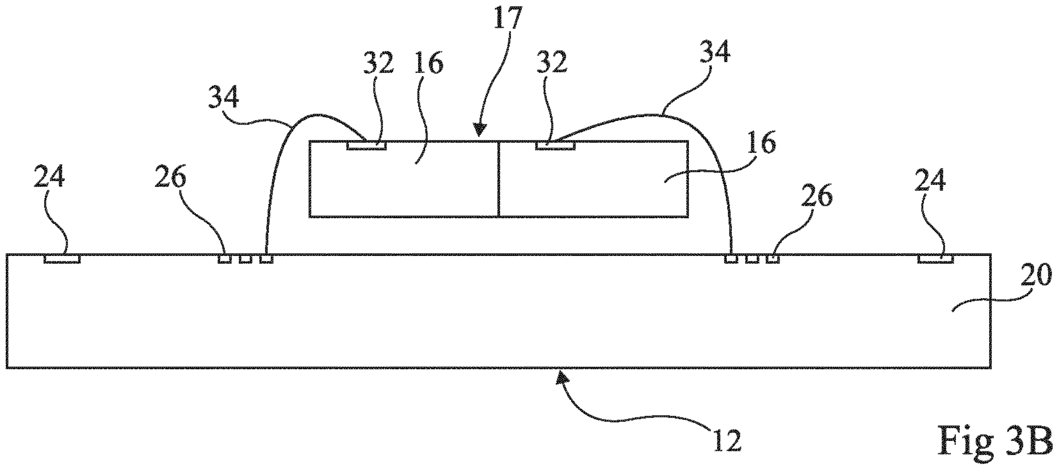
FIG. 3B illustrates, schematically, another side view of the embodiment of FIG. 2.

FIG. 2 illustrates, schematically, a top view of an embodiment of a chip 12 comprising several pixels 14. FIG. 3A illustrates, schematically, a side view of the embodiment of FIG. 2. FIG. 3B illustrates, schematically, another side view of the embodiment of FIG. 2. More precisely, FIG. 3A is a view according to the plan A-A of FIG. 2 and FIG. 3B is a view according to the plan B-B of FIG. 2.

The chip 12 comprises the pixels 14. As in the embodiment of FIG. 1, the chip 12 comprises four pixels 14. Each pixel 14 comprises three LEDs 14*a*, 14*b*, 14*c*. The LED 14*a* is for example configured to emit red light. The LED 14*b* is for example configured to emit blue light. The LED 14*c* is for example configured to emit green light.

The chip 12 comprises a support 20. The pixels 14 are for example formed in the support 20, the support 20 comprising for example a semiconductor substrate. Alternatively, the pixels 14 are formed on independent chips fixed on the support 20.

The support 20 comprises conductive tracks 22, 24, 26. The conductive tracks 22, 24, 26 are for example in metal. The conductive tracks 22, 24, 26 are located in the support 20, for example in an insulating layer, not represented. The conductive tracks 22, 24, 26 are at least partially, preferably entirely, located at the level of an upper face of the support 20. By upper face, it is meant the face the closest to the LEDs and the drivers 16. In other words, at least part of each conductive track 22, 24, 26 is accessible by the upper side of the support 20. For example, a face of each conductive track 22, 24, 26 is coplanar with the upper face of the support 20.

The support 20 comprises four conductive tracks 22. Each conductive track 22 comprises an extremity in contact with one of the pads 18. For example, an extremity of each conductive track 22 constitutes one of the pads 18. Therefore, one of the tracks 22 receives the voltage GND, one of the tracks 22 receives the voltage VCC, one of the tracks 22 receives the signal ROW and one of the tracks 22 receives the signal COL.

The support 20 comprises conductive tracks 24. In the example of FIGS. 2, 3A and 3B, the support 20 comprises two conductive tracks 24. One of the conductive tracks 24 extends between, and is in contact with, two of the pixels 14 and the other conductive track 24 extends between, and is in contact with, the other two pixels 14. The conductive tracks 24 are configured to provide all the pixels 14 of a same chip 12 with a voltage common to all the pixels. In the case in which the LEDs 14*a*, 14*b*, 14*c* of the pixels 14 are coupled with a common anode, the common voltage is for example the voltage VCC. In the case in which the LEDs 14*a*, 14*b*, 14*c* of the pixels 14 are coupled with a common cathode, the common voltage is for example the voltage GND.

The support 20 comprises for example as many conductive tracks 26 as the chip 12 comprises LEDs 14*a*, 14*b*, 14*c*. In the example of FIG. 2, the chip 12 comprises twelve LEDs 14*a*, 14*b* or 14*c* and twelve conductive tracks 26. Each conductive track 26 has an extremity connected to a LED 14*a*, 14*b* or 14*c*.

The driver circuit 17 comprising the drivers 16 is connected to the tracks 22, in order to receive the voltages VCC and GND and the signals ROW and COL. The driver circuit 17 comprising the drivers 16 is also connected to the tracks 26, in order to provide control voltages to the LEDs 14*a*, 14*b* and 14*c*.

For example, the driver circuit 17 comprises four connection pads 28, shown in FIG. 3A. For example, the connection pads 28 are located on the lower face of the driver circuit 17, in other words the face the closest to the support 20. Each connection pad 28 is connected to one of the tracks 22 by a metal ball 30. The driver circuit 17 therefore receives each of the voltages VCC and GND and the signals ROW and COL by the intermediary of a pad 18, a conductive track 22, a ball 30, and a connection pad 28.

The driver circuit 17 comprising the drivers 16 is fixed on the support 12. For example, the driver circuit 17 is fixed on the support 12 by the balls 30. The balls 30 are for example soldering balls. The driver circuit 17 and the support 20 are for example soldered together by the balls 30.

The driver circuit 17 comprises for example connection pads 32. The connection pads 32 are for example on the upper face of the driver circuit 17, in other words the face the furthest to the support 20. The driver circuit 17 for example comprises as many connection pads 32 as there is LEDs. In other words, the driver circuit 17 for example comprises as many connection pads 32 as there is conductive tracks 26. The conductive pads 32 are configured to be connected to wires 34. Each conductive track 26 is connected to a connection pad 32, for example by a wire 34.

Each driver 16 is configured to control, in other words to generate the control voltage, of the LEDs 14*a*, 14*b*, 14*c* of a pixel 14. Preferably, each driver 16 is configured to control, in other words to generate the control voltage, of all the LEDs 14*a*, 14*b*, 14*c* of a single pixel 14. Therefore, each driver 16 comprises as many connection pads 32 as there is LEDs in a pixel, for example three connection pads 32. In the example of FIG. 2, each driver 16 is configured to control an associated pixel 14, and comprises three connection pads 32, each connection pad 32 being connected to one of the LEDs 14*a*, 14*b*, 14*c* of the associated pixel 14 by a wire 34 and a track 26. Each driver 16 for example further comprises at least a memory and several transistors.

The drivers 16 are connected to each other by conductive tracks, not represented, located inside the driver circuit 17. In particular, all drivers 16 are preferably connected by conductive tracks inside the driver circuit 17 configured to provide to all the drivers 16 the voltages common to all the drivers 16. Said conductive tracks are for example configured to provide to all the drivers 16 with the voltages VCC and GND. Said conductive tracks are for example connected with the pads 28.

FIGS. 4 to 8 illustrate an embodiment of a chip such as the one of FIG. 2.

Figure 4:
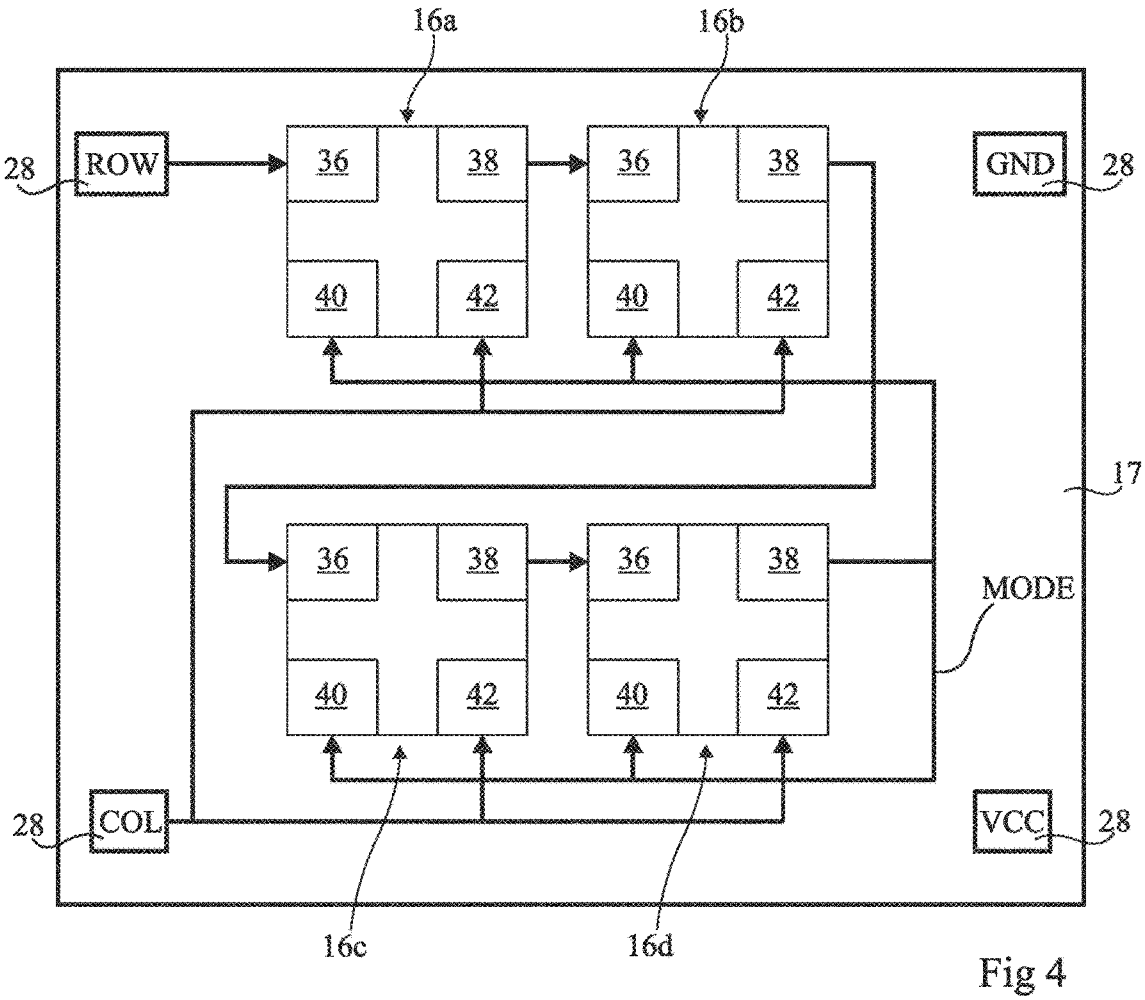
FIG. 4 illustrates, schematically, the connections of the pixel drivers of an embodiment of a chip such as the one of FIG. 2.

FIG. 4 illustrates, schematically, the connections of the pixel drivers 16 of an embodiment of the driver circuit 17 such as the one of FIG. 2.

The driver circuit 17 comprises the four connection pads 28, being provided with the voltages VCC and GND and the signals ROW and COL. The driver circuit 17 comprises, in this example, four pixel drivers 16, as in the example of FIG. 2. In FIG. 4, the four drivers 16 are designated by the references 16*a*, 16*b*, 16*c*, 16*d*, reference 16 being still used in relation to FIG. 4 to designate any one of the drivers 16*a*, 16*b*, 16*c*, 16*d*.

The drivers 16 are configured to receive sequentially the signal ROW. In other words, all drivers 16 comprise an input 36, configured to receive the signal ROW, and an output 38 configured to provide the signal ROW. The drivers 16 are connected in sequence by the input 36 and the output 38.

The first driver of the sequence, here the driver 16*a*, receives the signal ROW from the pad 28 on which is applied the signal ROW. In other words, the input 36 of the driver 16*a* is coupled, preferably connected, to the pad 28 on which is applied the signal ROW.

The driver 16*a* provides the signal ROW to the following driver in the sequence, here the driver 16*b*. The output 38 of the driver 16*a* is therefore coupled, preferably connected, to the input 36 of the following driver in the sequence. Similarly, the driver 16*b* is able to provide the signal ROW to the following driver in the sequence, here the driver 16*c*. The output 38 of the driver 16*b* is therefore coupled, preferably connected, to the input 36 of the following driver in the sequence. Similarly, the driver 16*c* is able to provide the signal ROW to the following driver in the sequence, here the driver 16*d*. The output 38 of the driver 16*c* is therefore coupled, preferably connected, to the input 36 of the following driver in the sequence.

All drivers 16 are part of the sequence. All drivers 16 receive on their input 36 the signal ROW from the previous driver in the sequence, or from the pad 28 for the first driver in the sequence.

All drivers 16 comprise an input 40 receiving a signal MODE. Signal MODE is for example a binary signal. All drivers receive the same signal MODE. In other words, all input 40 are coupled, preferably connected, together. The inputs 40 are further coupled, preferably connected, to the output 38 of the last driver 16*d* of the sequence.

All drivers 16 comprise an input 42. The inputs 42 are configured to receive the signal COL. All drivers receive the same signal COL. In other words, all inputs 42 are coupled, preferably connected, together. The inputs 42 are further coupled, preferably connected, to the pad 28 on which is applied the signal COL.

The drivers 16 are configured to receive the voltages GND and VCC, on inputs not represented. All drivers receive the same voltages GND and VCC. In other words, all inputs configured to receive the voltage VCC are coupled, preferably connected, together and all inputs configured to receive the voltage GND are coupled, preferably connected, together. The inputs configured to receive the voltage VCC are further coupled, preferably connected, to the pad 28 on which is applied the voltage VCC. The inputs configured to receive the voltage GND are further coupled, preferably connected, to the pad 28 on which is applied the voltage GND.

Figure 5:
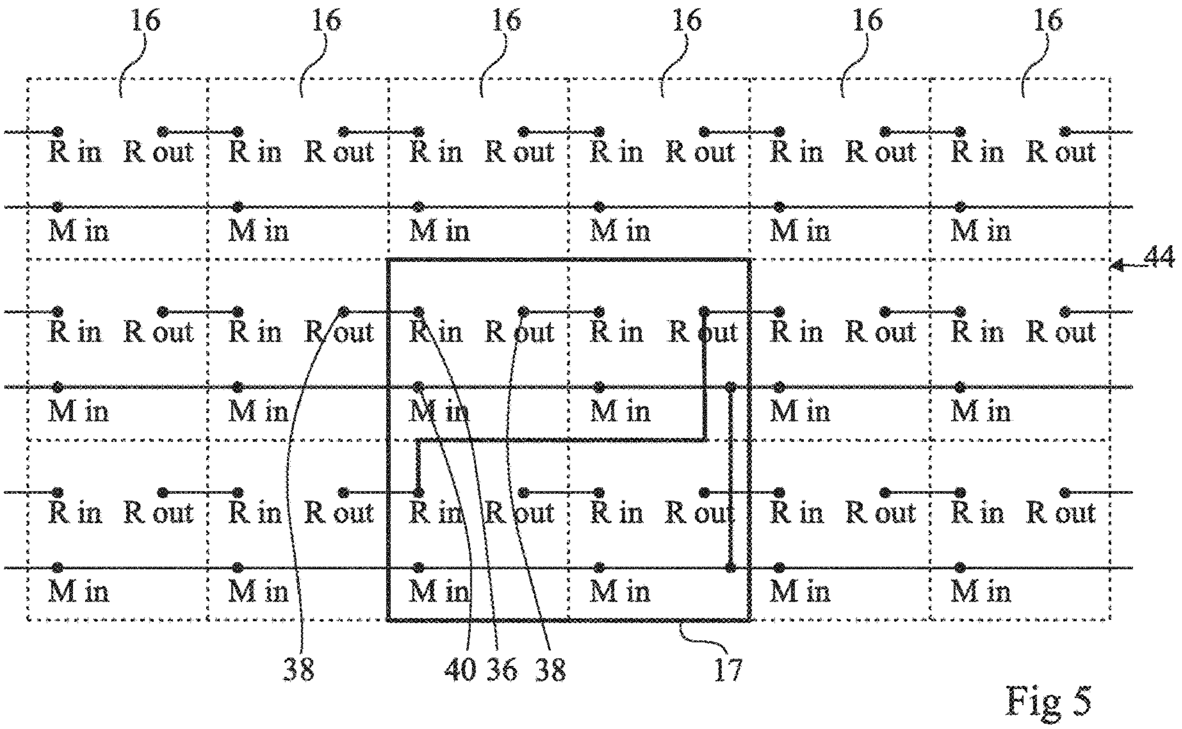
FIG. 5 illustrates the formations of the connections of the pixel drivers in the embodiment of FIG. 4.

FIG. 5 illustrates the formations of the connections of the pixel drivers 16 in the embodiment of FIG. 4.

The drivers 16 are for example formed on a semiconductor wafer 44. The wafer 44 comprises an array of drivers 16. The drivers 16 of FIG. 5 are separated from each other by dotted lines. In other words, the wafer 44 comprises rows (also called lines) and columns of drivers 16. All the drivers 16 of the wafer 44 are for example identical. Conductive tracks are formed in the wafer 44 in order to interconnect the different drivers 16.

The input 36 (R in) of each driver 16 is connected by a conductive track to the output 38 (R out) of the previous driver 16 on the same line. In other words, each driver 16 comprises an input 36 connected to the output 38 of a neighboring driver 16 on the same line and an output 38 connected to the input 36 of a neighboring driver 16 on the same line.

Furthermore, the input 40 (M in) of each driver 16 is connected, by conductive tracks preferably located in the wafer 44, with the inputs 40 of all the other drivers 16 of the same line.

The inputs 42, not represented in FIG. 5, receiving the signal COL, of all the drivers 16 are connected to each other by conductive tracks preferably located in the wafer 44. Similarly, the inputs, not represented in FIG. 5, receiving the voltage GND of all the drivers 16 are connected to each other by conductive tracks preferably located in the wafer 44. Similarly, the inputs, not represented in FIG. 5, receiving the voltage VCC of all the drivers 16 are connected to each other by conductive tracks preferably located in the wafer 44.

The wafer 44 is divided into driver circuits 17 corresponding to the chips 12. In the example of FIG. 5, a driver circuit 17 corresponding to the embodiment of FIG. 4, in other words comprising two lines and two columns, is illustrated, surrounded by a thick line. In this case, the wafer 44 is for example cut every two lines and every two columns in order to form a plurality of driver circuits 17 for a plurality of chips 12.

Further connections are formed on the driver circuit 17, for example by the formation of conductive tracks on the upper face of the driver circuit 17. In particular, one such connection is formed between the output 38 of each driver 16 at the end of a line and the input 36 of the driver 16 at the beginning of the following line. By a driver 16 at the end of a line, it is meant a driver 16 in which the connection between its output 38 and the input 36 of the following driver 16 in the wafer 44 has been cut by the separation of the driver circuits 17. By a driver 16 at the beginning of a line, it is meant a driver 16 in which the connection between its input 36 and the output 38 of the previous driver 16 in the wafer 44 has been cut by the separation of the driver circuits 17.

At least a conductive track is formed, for example on the upper face of the driver circuit 17, to connect the inputs 40 of all the lines and the output 38 of the driver 16 at the end of the last line, corresponding to the last driver 16 of the sequence. Therefore, the signal provided by the output 38 of the driver 16 at the end of the last line, corresponding to the last driver 16 of the sequence, is provided to the inputs 40 of all the drivers 16.

Figure 6:
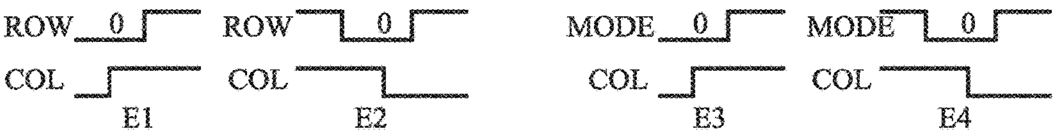
FIG. 6 illustrates several events.

FIG. 6 illustrates several examples of events E1, E2, E3 and E4 adapted to be observed by the drivers 16 of FIG. 4. By event, it is meant a specific combination of simultaneous patterns of two signals. The events E1, E2, E3 and E4 are used by the drivers 16 to determine the different modes of operation of the driver 16.

The event E1 corresponds to a rising edge of the signal COL while the signal ROW has a low value, corresponding to a binary “0”, followed by a rising edge of the signal ROW before the next falling edge of the signal COL, in other words while the signal COL has a high value, corresponding to a binary “1”.

The event E2 corresponds to a falling edge of the signal COL between a falling edge of the signal ROW and the next rising edge of the signal ROW.

The event E3 corresponds to a rising edge of the signal COL while the signal MODE, in other words the signal ROW provided simultaneously to all drivers, has a low value, corresponding to a binary “0”, followed by a rising edge of the signal MODE before the next falling edge of the signal COL, in other words while the signal COL has a high value, corresponding to a binary “1”.

The event E4 corresponds to a falling edge of the signal COL between a falling edge of the signal MODE and the next rising edge of the signal MODE.

Figure 7:
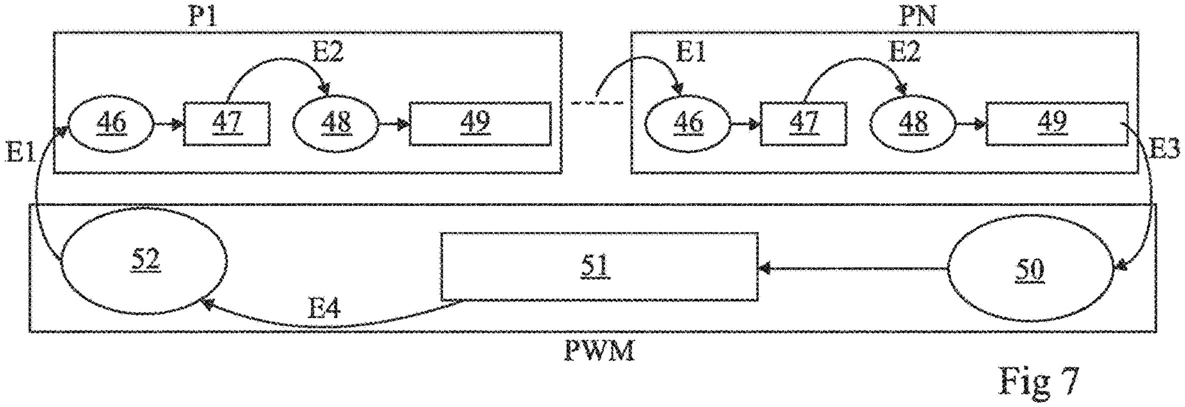
FIG. 7 illustrates, schematically, the operation of the embodiment of FIG. 4.

FIG. 7 illustrates, schematically, the operation of the embodiment of FIG. 4.

The operation of the chip 12 comprises steps P1 to PN corresponding to the successive programming of all the drivers in the order of the sequence in which the drivers are connected. The step P1 corresponds to the programming of the first driver of the sequence. The step PN correspond to the programming of the last driver in the sequence, the sequence comprising N drivers. In the example of FIG. 4, the value of N is four.

The operation of the chip 12 further comprises, after the programming of all the drivers, a step PWM of driving the LEDs in a pulse width modulation mode.

The step P1 of programming the first driver of the sequence is started by the observation, by the drivers, of the event E1 after a step PWM. More precisely, the event E1 starts (reference 46) the writing of the data in the first driver. The data is then written (reference 47) in the driver in order to program the illumination of the corresponding pixel. The observation by the driver of an event E2 commands the stopping of the data writing (reference 48). The step P1 comprises after the end of the data writing, a step (reference 49) in which the driver having been programmed, here the first driver of the sequence, is configured not to monitor the signal ROW and not to react to the events E1. Therefore, the driver transfers the signal ROW to the following driver without acting.

Each programming step P1 to PN comprises the steps 46, 47, 48, and 49. Each programming step P2 to PN is started by an event E1 following the precedent programming step. Before a driver is programmed, the signal ROW is not transmitted through said driver to the following driver. Therefore, a driver only receives the event E1 once the previous drivers in the sequence have been programmed. The signal ROW is shifted from the driver having been programmed to the driver being programmed at the end of each step P1 to PN.

After all the drivers have been programmed, in other words after the programming steps P1 to PN, the signal ROW is provided on the output of the last driver of the sequence, and therefore provided on the inputs 40 of all the drivers. The signal ROW is then considered as the signal MODE by all the drivers.

After the programming step, and at the observation of an event E3, the chip enters a PWM mode (reference 50). Therefore, until an event E4, the screen is illuminated (reference 51) in PWM mode, and all drivers receive, parallelly, a signal MODE, constituting the clock of the PWM mode. The drivers also use information stored in the memory of each driver. The signal COL is monitored, in order to check for the event E4. Meanwhile, the signal COL also provides data to other pixels of the same column.

Upon the observation of the event E4, the PWM mode stops (reference 52) and the chip gets ready to enter start programming the drivers. In other words, the drivers start monitoring the signal ROW waiting for the event E1. Upon the observation of the event E1, the step P1 starts again.

Figure 8:
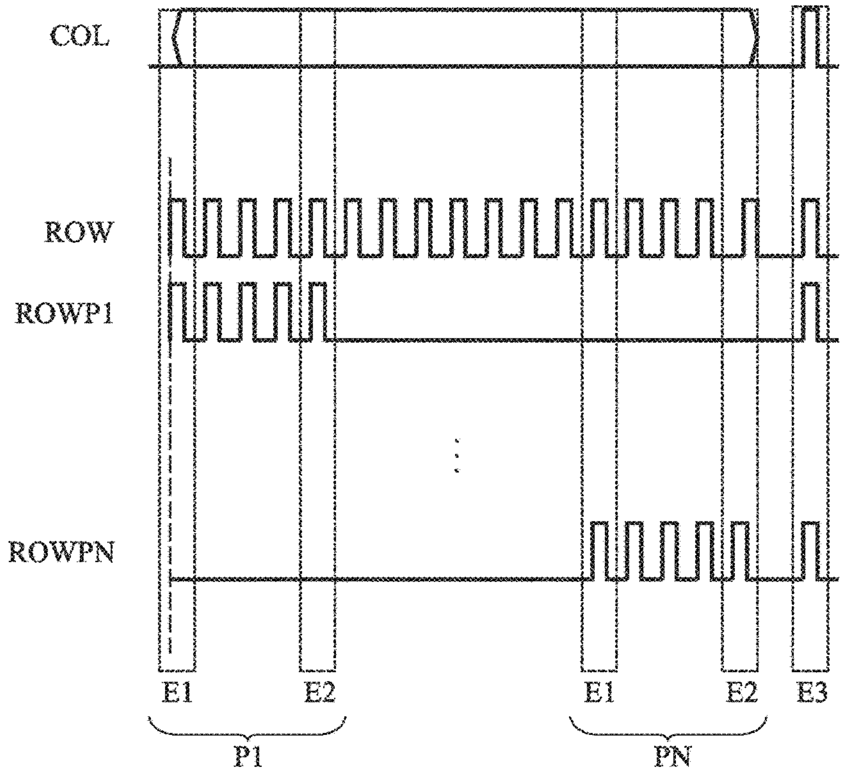
FIG. 8 illustrates, in more detail, the operation of the embodiment of FIG. 4.

FIG. 8 illustrates, in more detail, the operation of the embodiment of FIG. 4. More precisely, FIG. 8 illustrates the steps P1 to PN of programming the drivers. FIG. 8 is a chronogram representing the signal COL, the signal ROW, a signal ROWP1, corresponding to the signal ROW seen by the first driver in the sequence, and a signal ROWPN, corresponding to the signal ROW seen by the Nth driver in the sequence, N being the total number of drivers in the sequence, the value of N being for example four.

FIG. 8 illustrates the step P1. The step P1 starts with the event E1, only seen by the first driver in the sequence. The signal COL contains, during P1 the data to be programmed into the driver. The signal ROW constitutes a clock signal. In other words, the signal ROW is preferably a periodic binary voltage, oscillating between a high value and a low value. The signal ROWP1 is, during the step P1, identical to the signal ROW and is used by the first driver of the sequence as a clock signal. As the signal ROW is not provided by the first driver to the following drivers in the sequence, the signals ROWP2 (not represented) to ROWPN are identical and constant, for example equal to the low value.

At the event E2, the step P1 ends. The first driver is then configured to ignore the signal ROW. Therefore, the signal ROW is provided to the second driver but the signal ROWP1 seen by the driver is constant and for example equal to the low value.

Each following step P2 to PN is similar. Said step starts with the event E1, only seen by the driver being programmed. The signal COL contains, during said step the data to be programmed into the driver. The signal ROWP2 to ROWPN is, during said step, identical to the signal ROW and is used by the driver being programmed as a clock signal. The signal ROW is not provided by the driver being programmed during said step to the following drivers in the sequence. At the event E2, said step ends. The driver is then configured to ignore the signal ROW. Therefore, the signal ROW is provided to the following driver but the signal seen by the driver is constant and for example equal to the low value.

After the event E2 indicating the end of the step PN, the event E3 indicates the end of the programming and the start of the PWM mode.

FIGS. 9 to 12 illustrate another embodiment of a chip such as the one of FIG. 2.

Figure 9:
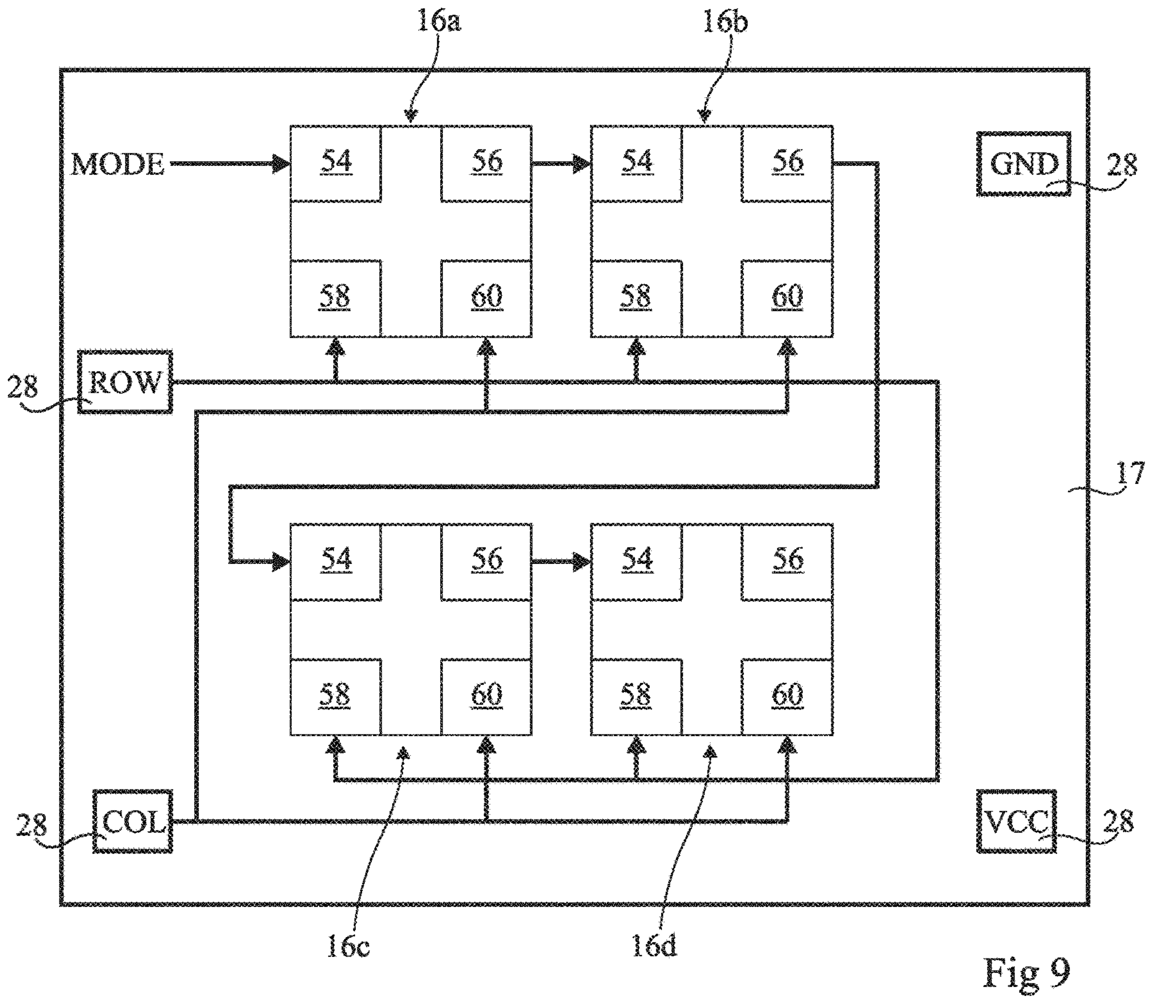
FIG. 9 illustrates, schematically, the connections of the pixel drivers of another embodiment of a chip such as the one of FIG. 2.

FIG. 9 illustrates, schematically, the connections of the pixel drivers 16 of another embodiment of the driver circuit 17 such as the one of FIG. 2.

The embodiment of FIG. 9 differs from the embodiment of FIG. 4 in that the signal which is transferred to the driver of the sequence being programmed is the signal MODE, the driver being configured to see the signal ROW when the signal MODE has a high value.

The driver circuit 17 comprises, as in FIG. 4, the four connection pads 28, being provided with the signals ROW and COL, and the voltages VCC and GND. The driver circuit 17 comprises, in this example, four pixel drivers 16, as in the example of FIG. 2. In FIG. 9, the four drivers 16 are designated by the references 16*a*, 16*b*, 16*c*, 16*d*, reference 16 being still used in relation to FIG. 9 to designate any one of the drivers 16*a*, 16*b*, 16*c*, 16*d*.

The drivers 16 are configured to receive sequentially the signal MODE, configured to be constant and to have the high value. In other words, all drivers 16 comprise an input 54, configured to receive the signal MODE, and an output 56 configured to provide the signal MODE.

The first driver of the sequence, here the driver 16*a*, receives the signal MODE from a generation circuit internal to the chip 12 configured to generate, from the voltage VCC, a constant high value corresponding to a binary "1".

The driver 16*a* is able to provide the signal MODE to the following driver in the sequence, here the driver 16*b*. The output 56 of the driver 16*a* is therefore coupled, preferably connected, to the input 54 of the following driver in the sequence.

Similarly, the driver 16*b* is able to provide the signal MODE to the following driver in the sequence, here the driver 16*c*. The output 56 of the driver 16*b* is therefore coupled, preferably connected, to the input 54 of the following driver in the sequence.

Similarly, the driver 16*c* provides the signal MODE to the following driver in the sequence, here the driver 16*d*. The output 56 of the driver 16*c* is therefore coupled, preferably connected, to the input 54 of the following driver in the sequence.

All drivers 16 are part of the sequence. All drivers 16 receive on their input 54 the signal MODE from the previous driver in the sequence, or from the internal source for the first driver in the sequence.

All drivers 16 comprise an input 58. The signal received on the input 58 is the signal ROW. All drivers receive the same signal ROW. In other words, all input 58 are coupled, preferably connected, together. The inputs 58 are further coupled, preferably connected, to the pad 28 on which is applied the signal ROW.

All drivers 16 comprise an input 60. The inputs 60 are configured to receive the signal COL. All drivers 16 receive the same signal COL. In other words, all inputs 60 are coupled, preferably connected, together. The inputs 60 are further coupled, preferably connected, to the pad 28 on which is applied the signal COL.

The drivers 16 are configured to receive the voltages GND and VCC, on inputs not represented. All drivers receive the same voltage. In other words, all inputs configured to receive the voltage VCC are coupled, preferably connected, together and all inputs configured to receive the voltage GND are coupled, preferably connected, together. The inputs configured to receive the voltage VCC are further coupled, preferably connected, to the pad 28 on which is applied the voltage VCC. The inputs configured to receive the voltage GND are further coupled, preferably connected, to the pad 28 on which is applied the voltage GND.

Figure 10:
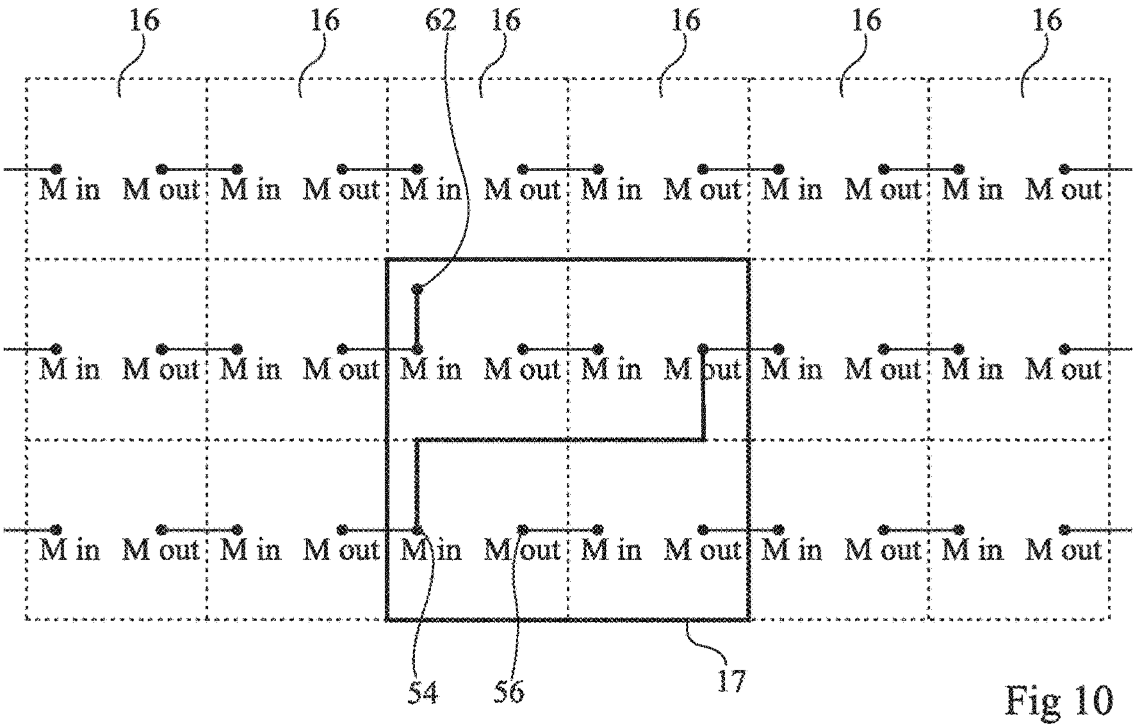
FIG. 10 illustrates the formations of the connections of the pixel drivers in the embodiment of FIG. 9.

FIG. 10 illustrates the formations of the connections of the pixel drivers 16 in the embodiment of FIG. 9.

The drivers 16 are for example formed on a semiconductor wafer 44. The wafer 44 comprises an array of drivers 16. The drivers 16 of FIG. 10 are separated from each other by dotted lines. In other words, the wafer 44 comprises rows (also called lines) and columns of drivers 16. All the drivers 16 of the wafer 44 are for example identical. Conductive tracks are formed in the wafer 44 in order to interconnect the different drivers 16.

The input 54 (M in) of each driver 16 is connected by a conductive track to the output 56 (M out) of the previous driver 16 on the same line. In other words, each driver 16 comprises an input 54 connected to the output 56 of a neighboring driver 16 on the same line and an output 56 connected to the input 54 of a neighboring driver 16 on the same line.

The inputs 60, not represented in FIG. 10, receiving the signal COL, of all the drivers 16 are connected to each other by conductive tracks preferably located in the wafer 44. Similarly, the inputs, not represented in FIG. 10, receiving the signal ROW of all the drivers 16 are connected to each other by conductive tracks preferably located in the wafer 44. Similarly, the inputs, not represented in FIG. 10, receiving the voltage GND of all the drivers 16 are connected to each other by conductive tracks preferably located in the wafer 44. Similarly, the inputs receiving the voltage VCC of all the drivers 16 are connected to each other by conductive tracks preferably located in the wafer 44.

The wafer 44 is divided into driver circuits 17 corresponding to the chips 12. In the example of FIG. 10, a driver circuit 17 corresponding to the embodiment of FIG. 9, in other words comprising two lines and two columns, is illustrated, surrounded by a thick line. In this case, the wafer 44 is for example cut every two lines and every two columns in order to form a plurality of driver circuits 17 for a plurality of chips 12.

Further connections are formed in the driver circuit 17, for example by the formation of conductive tracks on the upper face of the driver circuit 17. In particular, one such connection is formed between the output 56 of each driver 16 at the end of a line and the input 54 of the driver 16 at the beginning of the following line. By a driver 16 at the end of a line, it is meant a driver 16 in which the connection between its output 56 and the input 54 of the following driver 16 in the wafer 44 has been cut by the separation of the driver circuits 17. By a driver 16 at the beginning of a line, it is meant a driver 16 in which the connection between its input 54 and the output 56 of the previous driver 16 in the wafer 44 has been cut by the separation of the driver circuits 17.

At least a conductive track is formed, for example on the upper face of the driver circuit 17, to connect the input 54 of the first driver 16 of the sequence to a pad connected to the source of the signal MODE. The source of the signal MODE is for example located on or in the support of the chip 12. The source of the signal MODE is configured to generate the signal MODE having a constant value.

Figure 11:
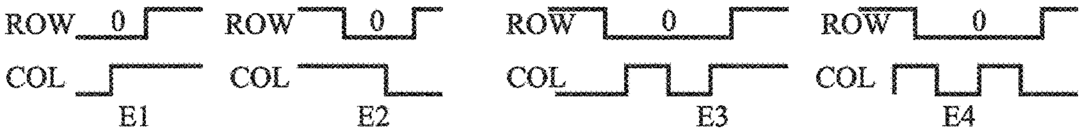
FIG. 11 illustrates several events.

FIG. 11 illustrates several examples of events E1, E2, E3 and E4 adapted to be observed by the drivers 16 of FIG. 9. The events E1, E2, E3 and E4 are used by the drivers 16 to determine the different modes of operation of the driver 16.

The events E1 and E2 of FIG. 11 are identical to the events E1 and E2 of FIG. 6. In other words, the event E1 corresponds to a rising edge of the signal COL while the signal ROW has a low value, corresponding to a binary "0", followed by a rising edge of the signal ROW before the next falling edge of the signal COL, in other words while the signal COL has a high value, corresponding to a binary "1".

The event E2, as in FIG. 6, corresponds to a falling edge of the signal COL between a falling edge of the signal ROW and the next rising edge of the signal ROW.

The event E3 corresponds to two rising edges of the signal COL between a falling edge of the signal ROW and the next rising edge of the signal ROW.

The event E4 corresponds to two falling edges of the signal COL between a falling edge of the signal ROW and the next rising edge of the signal ROW.

Figure 12:
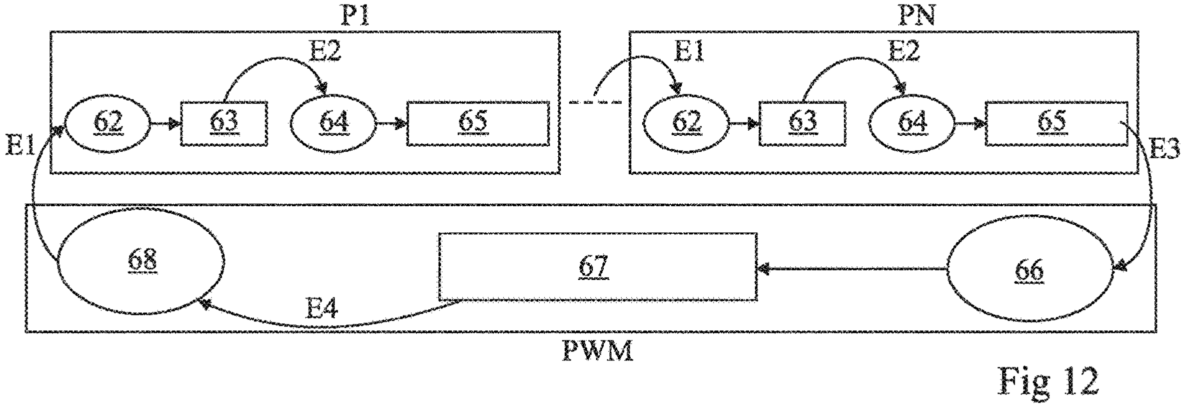
FIG. 12 illustrates, schematically, the operation of the embodiment of FIG. 9.

FIG. 12 illustrates, schematically, the operation of the embodiment of FIG. 9.

The operation of the chip 12 comprises steps P1 to PN corresponding to the successive programming of all the drivers in the order of the sequence in which the drivers are connected. The step P1 corresponds to the programming of the first driver of the sequence. The step PN correspond to the programming of the last driver in the sequence, the sequence comprising N drivers. In the example of FIG. 12, the value of N is four.

The operation of the chip 12 further comprises, after the programming of all the drivers, a step PWM of driving the LEDs in a pulse width modulation mode.

The step P1 of programming the first driver of the sequence is started by the observation, by the drivers, of the event E1 after a step PWM. More precisely, the event E1 starts (reference 62) the writing of the data in the first driver. The data is then written (reference 63) in the driver in order to program the illumination of the corresponding pixel. The observation by the driver of an event E2 commands the stopping of the writing (reference 64). The step P1 comprises after the end of the data writing, a step (reference 65) in which the driver having been programmed, here the first driver of the sequence, is configured to transmit the signal MODE to the next driver in the sequence. Furthermore, the driver is configured to monitor the signal ROW for the event E3, upon which said driver will operate in the PWM mode.

Each programming step P1 to PN comprises the steps 62, 63, 64, and 65. Each programming step P2 to PN is started by an event E1 following the precedent programming step. Before a driver is programmed, the signal MODE is not transmitted through said driver to the following driver, and the signal MODE has thus a low value. Therefore, as the drivers are configured to check on the signal ROW only when the signal MODE has a high value, a driver only receives the event E1 after the previous drivers in the sequence have been programmed. This allows the same voltage to select the drivers one after the other, and to avoid conflict in the programming. The signal MODE is shifted from the driver having been programmed to the driver being programmed at the end of each step P1 to PN−1.

After all the drivers have been programmed, in other words after the programming steps P1 to PN, all drivers receive a signal MODE equal to the high value.

After the programming step, and at the observation of an event E3 as described in FIG. 11, the chip enters a PWM mode (reference 66). Therefore, until an event E4, the screen is illuminated (reference 67) in PWM mode, and all drivers receive, parallelly, the signal ROW, constituting the clock of the PWM mode. The drivers also use information stored in the memory of each driver. The signal COL is monitored, in order to check for the event E4. Meanwhile, the signal COL also provides data to other pixels of the same column.

Upon the observation of the event E4, the PWM mode stops (reference 68) and the chip gets ready to start programming the drivers again. In other words, the drivers monitor the signal ROW waiting for the event E1. Upon the observation of the event E1, the step P1 starts again.

Figure 13:
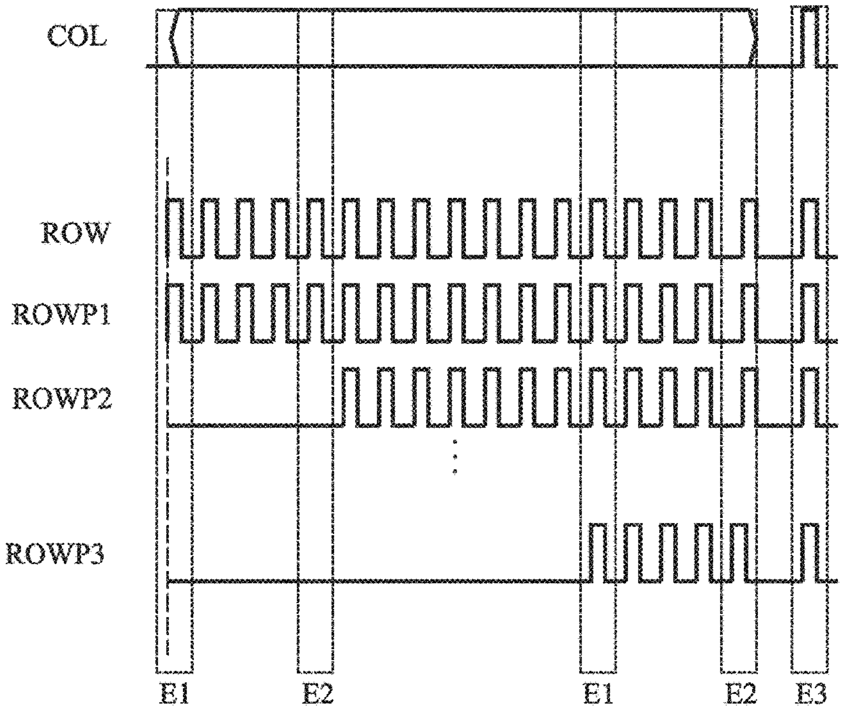
FIG. 13 illustrates, in more detail, the operation of the embodiment of FIG. 9.

FIG. 13 illustrates, in more detail, the operation of the embodiment of FIG. 9.

More precisely, FIG. 13 illustrates the steps P1 to PN of programming the drivers. FIG. 13 is a chronogram representing the signal COL, the signal ROW, a signal ROWP1, corresponding to the signal ROW seen by the first driver in the sequence, a signal ROWP2, corresponding to the signal ROW seen by the second driver in the sequence, and a signal ROWPN, corresponding to the signal ROW seen by the Nth driver in the sequence, N being the total number of drivers in the sequence, the value of N being for example four.

FIG. 13 illustrates the step P1. The step P1 starts with the event E1, only seen by the first driver in the sequence. The signal COL contains, during P1 the data to be programmed into the first driver. The signal ROW constitutes a clock signal. The signal ROWP1 is, during the step P1, identical to the signal ROW and is used by the first driver of the sequence as a clock signal. As the signal MODE is not provided by the first driver to the following drivers in the sequence, the signals ROWP2 to ROWPN are identical and constant, for example equal to the low value.

At the event E2, the step P1 ends. The first driver is then configured to monitor signals ROW and COL, waiting for the event E3.

Each following step P2 to PN is similar and comprises the steps 62, 63, 64, 65.

After the event E2 indicating the end of the step PN, the event E3 indicates the end of the programming and the start of the PWM mode.

FIGS. 14 to 18 illustrate another embodiment of a chip such as the one of FIG. 2.

Figure 14:
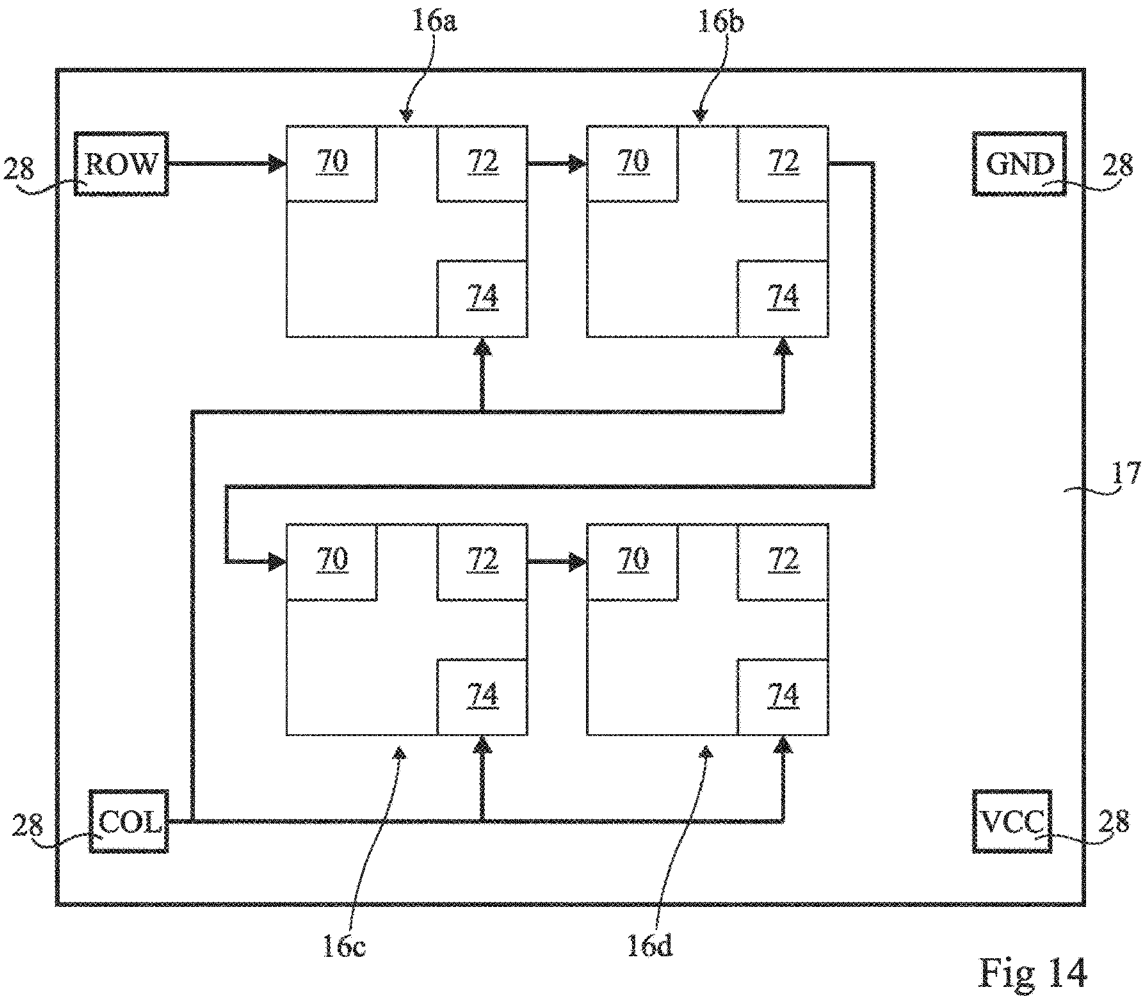
FIG. 14 illustrates, schematically, the connections of the pixel drivers of another embodiment of a chip such as the one of FIG. 2.

FIG. 14 illustrates, schematically, the connections of the pixel drivers 16 of another embodiment of the driver circuit 17 such as the one of FIG. 2.

The driver circuit 17 comprises the four connection pads 28, being provided with the signals ROW, COL, and the voltages VCC and GND. The circuit 17 comprises, in this example, four pixel drivers 16, as in the example of FIG. 2. In FIG. 14, the four drivers 16 are designated by the references 16*a*, 16*b*, 16*c*, 16*d*, reference 16 being still used in relation to FIG. 14 to designate any one of the drivers 16*a*, 16*b*, 16*c*, 16*d*.

The drivers 16 are configured to receive sequentially the signal ROW. In other words, all drivers 16 comprise an input

70, configured to receive the signal ROW, and an output 72 configured to provide the signal ROW.

The first driver of the sequence, here the driver 16*a*, receives the signal ROW from the pad 28 on which is applied the signal ROW. In other words, the input 70 of the driver 16*a* is coupled, preferably connected, to the pad 28 on which is applied the signal ROW.

The driver 16*a* provides the signal ROW to the following driver in the sequence, here the driver 16*b*. The output 72 of the driver 16*a* is therefore coupled, preferably connected, to the input 70 of the following driver in the sequence.

Similarly, the driver 16*b* is able to provide the signal ROW to the following driver in the sequence, here the driver 16*c*. The output 72 of the driver 16*b* is therefore coupled, preferably connected, to the input 70 of the following driver in the sequence.

Similarly, the driver 16*c* is able to provide the signal ROW to the following driver in the sequence, here the driver 16*d*. The output 72 of the driver 16*c* is therefore coupled, preferably connected, to the input 70 of the following driver in the sequence.

All drivers are part of the sequence. All drivers receive on their input 70 the signal ROW from the previous driver in the sequence, or from the pad 28 for the first driver in the sequence.

All drivers 16 comprise an input 74. The inputs 74 are configured to receive the signal COL. All drivers receive the same signal COL. In other words, all inputs 74 are coupled, preferably connected, together. The inputs 74 are further coupled, preferably connected, to the pad 28 on which is applied the signal COL.

The drivers 16 are configured to receive the voltages GND and VCC, on inputs not represented. All drivers receive the same voltage. In other words, all inputs configured to receive the voltage VCC are coupled, preferably connected, together and all inputs configured to receive the voltage GND are coupled, preferably connected, together. The inputs configured to receive the voltage VCC are further coupled, preferably connected, to the pad 28 on which is applied the voltage VCC. The inputs configured to receive the voltage GND are further coupled, preferably connected, to the pad 28 on which is applied the voltage GND.

The embodiment of FIG. 14 differs from the embodiment of FIG. 4 in that the drivers 16 do not receive or provide the signal MODE.

Figure 15:
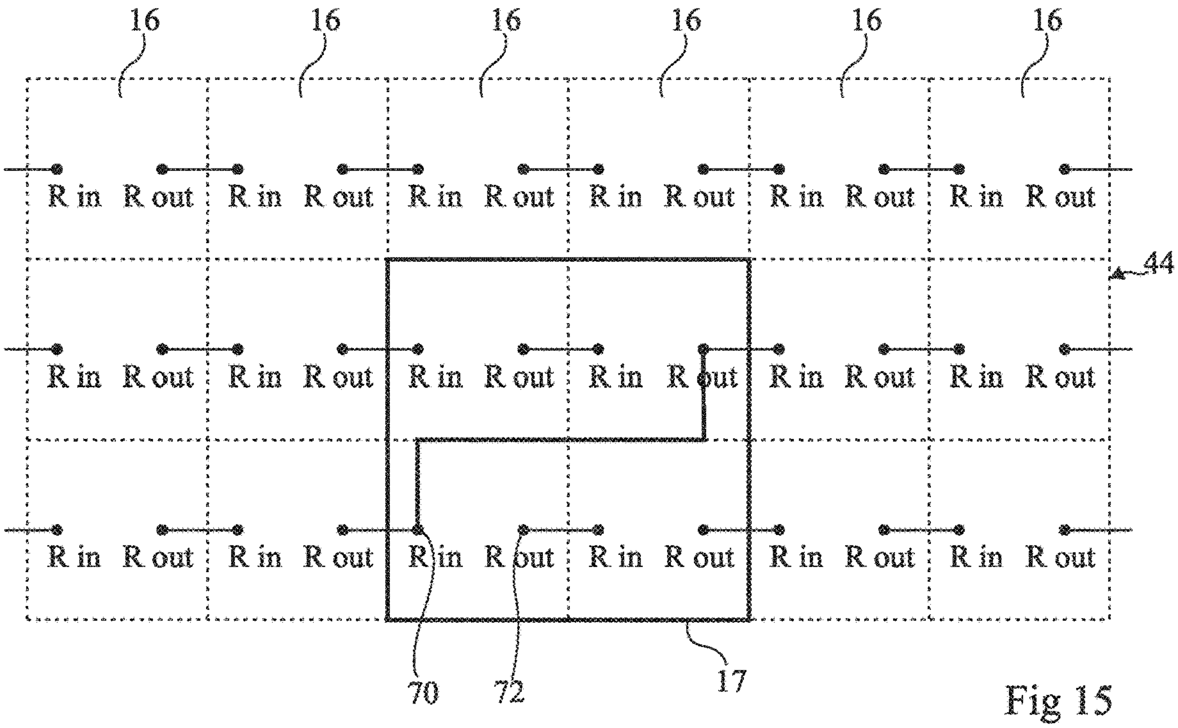
FIG. 15 illustrates the formations of the connections of the pixel drivers in the embodiment of FIG. 14.

FIG. 15 illustrates the formations of the connections of the pixel drivers 16 in the embodiment of FIG. 14.

The drivers 16 are for example formed on a semiconductor wafer 44. The wafer 44 comprises an array of drivers 16. The drivers 16 of FIG. 15 are separated from each other by dotted lines. In other words, the wafer 44 comprises rows (also called lines) and columns of drivers 16. All the drivers 16 of the wafer 44 are for example identical. Conductive tracks are formed in the wafer 44 in order to interconnect the different drivers 16.

The input 70 (R in) of each driver 16 is connected by a conductive track to the output 72 (R out) of the previous driver 16 on the same line. In other words, each driver 16 comprises an input 70 connected to the output 72 of a neighboring driver 16 on the same line and an output 72 connected to the input 70 of a neighboring driver 16 on the same line.

The inputs 74, not represented in FIG. 14, receiving the signal COL, of all the drivers 16 are connected to each other by conductive tracks preferably located in the wafer 44. Similarly, the inputs, not represented in FIG. 14, receiving the voltage GND of all the drivers 16 are connected to each other by conductive tracks preferably located in the wafer 44. Similarly, the inputs, not represented in FIG. 14, receiving the voltage VCC of all the drivers 16 are connected to each other by conductive tracks preferably located in the wafer 44.

The wafer 44 is divided into driver circuits 17 corresponding to the chips 12. In the example of FIG. 15, a driver circuit 17 corresponding to the embodiment of FIG. 14, in other words comprising two lines and two columns, is illustrated, surrounded by a thick line. In this case, the wafer 44 is for example cut every two lines and every two columns in order to form a plurality of driver circuits 17 for a plurality of chips 12. The connections between the drivers 16 of a driver circuit 17 and the drivers 16 outside the driver circuit 17 are cut by the separation of the driver circuit 17.

Further connections are formed in or on the driver circuit 17, for example by the formation of conductive tracks on the upper face of the driver circuit 17. In particular, one such connection is formed between the output 72 of each driver 16 at the end of a line and the input 70 of the driver 16 at the beginning of the following line. By a driver 16 at the end of a line, it is meant a driver 16 in which the connection between its output 72 and the input 70 of the following driver 16 in the wafer 44 has been cut by the separation of the driver circuits 17. By a driver 16 at the beginning of a line, it is meant a driver 16 in which the connection between its input 70 and the output 72 of the previous driver 16 in the wafer 44 has been cut by the separation of the driver circuits 17.

Figure 16:
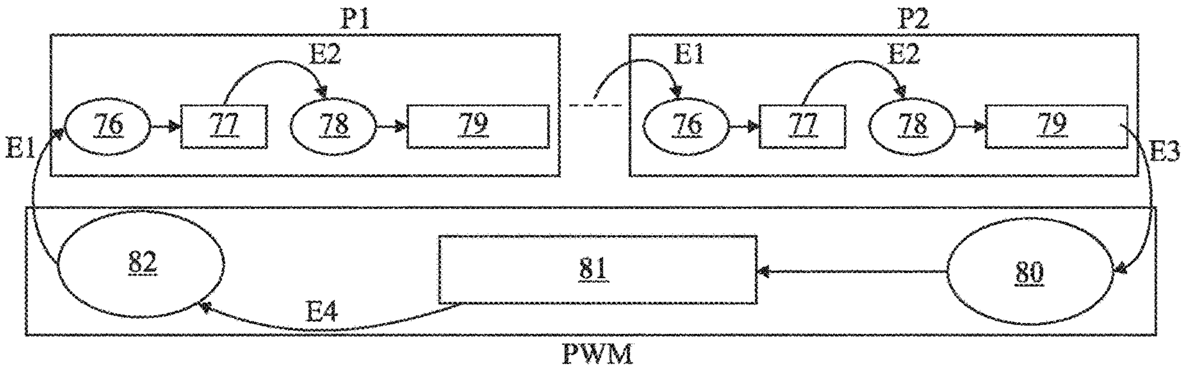
FIG. 16 illustrates, schematically, the operation of the embodiment of FIG. 14.

FIG. 16 illustrates, schematically, the operation of the embodiment of FIG. 14. The events E1, E2, E3, E4 are for example the same events as the events E1, E2, E3, E4 described in relation with FIG. 11.

The operation of the chip 12 comprises steps P1 to PN corresponding to the successive programming of all the drivers in the order of the sequence in which the drivers are connected. The step P1 corresponds to the programming of the first driver of the sequence. The step PN correspond to the programming of the last driver in the sequence, the sequence comprising N drivers. In the example of FIG. 16, the value of N is four.

The operation of the chip 12 further comprises, after the programming of all the drivers, a step PWM of driving the LEDs in a pulse width modulation mode.

The step P1 of programming the first driver of the sequence is started by the observation, by the drivers, of the event E1 after a step PWM. More precisely, the event E1 starts (reference 76) the writing of the data in the first driver. The data is then written (reference 77) in the driver in order to program the illumination of the corresponding pixel. The observation by the driver of an event E2 commands the stopping of the writing (reference 78). The step P1 comprises after the end of the data writing, a step (reference 79) in which the driver having been programmed, here the first driver of the sequence, is configured to put an internal value from a first value indicating that the driver is waiting to be programmed or is being programmed, to a second value indicating that the driver is ready for the PWM mode. Furthermore, the driver is configured to monitor the signal ROW for the event E3, upon which said driver will operate in the PWM mode and to permit the passage of the data on the signal ROW to the next driver to program the next driver.

Each programming step P1 to PN comprises the steps 62, 63, 64, and 65. After all the drivers have been programmed, in other words after the programming steps P1 to PN, all drivers receive a signal ROW equal to the high value.

After the programming step, and at the observation of an event E3 as described in FIG. 11, the chip enters a PWM mode (reference 80). Therefore, until an event E4, the screen is illuminated (reference 81) in PWM mode, and all drivers receive, parallelly, the signal ROW, constituting the clock of the PWM mode. The drivers also use information stored in the memory of each driver. The signal COL is monitored, in order to check for the event E4. Meanwhile, the signal COL also provide data to other pixels of the same column.

Upon the observation of the event E4, the PWM mode stops (reference 82) and the chip gets ready to start programming the drivers again. In other words, the drivers monitor the signal ROW waiting for the event E1. Upon the observation of the event E1, the step P1 starts again.

Various embodiments and variants have been described. Those skilled in the art will understand that certain features of these embodiments can be combined and other variants will readily occur to those skilled in the art.

Finally, the practical implementation of the embodiments and variants described herein is within the capabilities of those skilled in the art based on the functional description provided hereinabove.

The invention claimed is:

1. A method of controlling a chip, the chip comprising:

four connection pads, the pads receiving respectively a supply voltage, a reference voltage, a first data signal, and a second data signal;

at least two pixels;

at least two drivers, each driver being configured to control one of the pixels, the drivers being coupled in a sequence;

each driver comprising a first input and a first output, the first output of each driver being coupled to the first input of the following driver in the sequence, each driver being configured, in a programing step, to be programmed by storing digital data from the second data signal, and, in a display step, to drive one of the pixels from the stored digital data and from the first data signal, the method comprising:

providing all drivers of the sequence with a first control signal among the first data signal, the second data signal, and a third data signal, and providing all drivers of the sequence with a second control signal among the first data signal, the second data signal, and the third data signal or having all the drivers generate the second control signal;

providing a third control signal among the first data signal, the second data signal and the third data signal to the first input of the first driver of the sequence to initiate the programming step;

transmitting, for each driver of the sequence, after the programming of one of drivers of the sequence, the third control signal to the next driver of the sequence by their respective first output and first input, the programmed driver being configured to ignore the first or third control signal until the end of the programming of all the drivers of the sequence; and when all the drivers are programmed, having all the drivers monitoring the first and third control signals for starting the display step.

2. The method according to claim 1, wherein the drivers belong to a monolithic driver circuit.

3. The method according to claim 2, wherein each driver comprises at least a second, a third and a fourth input, the second inputs being coupled, by conductive tracks of the monolithic driver circuit, to each other and to the pad being provided with the supply voltage, the third inputs being coupled, by conductive tracks of the monolithic driver circuit, to each other and to the pad being provided with the reference voltage, the fourth inputs being coupled, by conductive tracks of the monolithic driver circuit, to each other and to the pad being provided with the second data signal.

4. The method according to claim 1, wherein the second control signal is provided to all the drivers.

5. The method according to claim 4, wherein the first control signal is the second data signal, the second control signal is the third data signal, and the third control signal is the first data signal.

6. The method according to claim 5, wherein each driver comprises a fifth input coupled to the first output of the last driver of the sequence.

7. The method according to claim 4, wherein the first control signal is the second data signal, the second control signal is the first data signal, and the third control signal is the third data signal being a binary signal having a first value when programming possible, and a second value when not programming.

8. The method according to claim 1, wherein the first control signal is the second data signal, the second control signal is the third data signal, and the third control signal is the first data signal, and wherein each driver is configured to store the third data signal as a binary signal given a first value before the programming of the driver, and given a second value upon programming of the driver.

9. The method according to claim 1, wherein the beginning and/or the end of the programming of each driver are respectively indicated to the driver being programmed by a first and second combination of pattern of the first and second data signals.

10. The method according to claim 1, wherein the method comprises an alternance of programming steps and display steps during which the pixels are illuminated according to the programing of the drivers.

11. The method according to claim 10, wherein the beginning and the end of the display step are respectively indicated to the drivers by a third and fourth combination of pattern of the first and second data signals.

12. A method of controlling a device comprising a plurality of chips controlled by a method according to claim 1, the chips forming an array, the first data signal being provided to all the chips of the row of the chip to be programmed, the second data signal being provided to all the chips of the column of the chip to be programmed.

13. A chip, the chip comprising:

four connection pads, the pads receiving respectively a supply voltage, a reference voltage, a first data signal, and a second data signal;

at least two pixels;

at least two drivers, each driver being configured to control one of the pixels, the drivers being coupled in a sequence;

each driver comprising a first input and a first output, the first output of each driver being coupled to the first input of the following driver in the sequence, each driver being configured, in a programing step, to be programmed by storing digital data from the second data signal, and, in a display step, to drive one of the pixels from the stored digital data and from the first data signal, the chip being configured to:

provide all drivers of the sequence with a first control signal among the first data signal, the second data signal, and a third data signal and providing all drivers of the sequence with a second control signal among the first data signal, the second data signal, and the third data signal or having all the drivers generate the second control signal;

provide a third control signal among the first data signal, the second data signal, and the third data signal to the first input of the first driver of the sequence to initiate the programming step;

transmit, for each driver of the sequence, after the programming of one of the drivers of the sequence, the third control signal to the next driver of the sequence by their respective first output and first input, the programmed driver being configured to ignore the first or third control signal until the end of the programming of all the drivers of the sequence; and when all the drivers are programmed, have all the drivers monitoring the first and third control signals for starting the display step.

14. A manufacturing method of a device according to claim 13, comprising:

the formation of identical drivers on a wafer;

the formation of first conductive tracks in the wafer, the first conductive tracks being identical in every driver;

the cutting of the array of drivers corresponding to the chip;

the formation of second conductive tracks on the wafer, one of the second conductive tracks connecting the first output of the last driver of each row to the first input of the first driver of the next row; and the fixation of the array of drivers on a support comprising the pixels.

15. The method according to claim 14, wherein a first conductive track connects each first output of the drivers to the first input of the next driver in the same row.

* * * * *